United States Patent [19]
Nakamura et al.

[11] Patent Number: 5,502,313
[45] Date of Patent: Mar. 26, 1996

[54] EXPOSURE APPARATUS AND METHOD HAVING A MEASURING UNIT FOR MEASURING DISTANCES BETWEEN A MASK SURFACE AND A PROJECTION OPTICAL SYSTEM

[75] Inventors: Osamu Nakamura, Urawa; Masamitsu Yanagihara, Yokohama; Hideji Goto, Kawasaki, all of Japan

[73] Assignee: Nikon Corporation, Tokyo, Japan

[21] Appl. No.: 302,479

[22] Filed: Sep. 12, 1994

[30] Foreign Application Priority Data

Sep. 14, 1993 [JP] Japan .................................. 5-252528

[51] Int. Cl.⁶ .................................................. G01N 21/86
[52] U.S. Cl. ................ 250/559.26; 250/548; 250/201.2; 355/53; 356/401
[58] Field of Search ......................... 250/559.26, 559.27, 250/559.3, 548, 201.2, 201.4, 201.5; 356/401, 400, 355, 357; 355/53

[56] References Cited

U.S. PATENT DOCUMENTS 5,155,370  10/1992  Osawa et al. ........................ 356/401
5,166,754  11/1992  Suzuki et al. ....................... 356/401

*Primary Examiner*—Edward P. Westin
*Assistant Examiner*—Que T. Le
*Attorney, Agent, or Firm*—Shapiro and Shapiro

[57] ABSTRACT

An exposure apparatus includes a projection optical system for projecting a pattern on a mask onto a photosensitive substrate and a measuring unit for measuring distances between the mask and the projection optical system at a plurality of positions within a surface of the mask. The position of the photosensitive substrate with respect to the projection optical system is changed on the basis of a plurality of the distances measured by the measuring unit.

10 Claims, 3 Drawing Sheets

EXPOSURE APPARATUS AND METHOD HAVING A MEASURING UNIT FOR MEASURING DISTANCES BETWEEN A MASK SURFACE AND A PROJECTION OPTICAL SYSTEM

BACKGROUND OF THE INVENTION

1. Field of the Invention

The present invention relates to a projection exposure apparatus suitably used to manufacture, e.g., a semiconductor integrated circuit, and a large flat panel display.

2. Related Background Art

In a conventional projection exposure apparatus for manufacturing, e.g., a semiconductor integrated circuit and a large flat panel display, one mask (reticle) is held on a predetermined mask holder, and light from a light source is radiated on a photosensitive substrate through the mask and a projection optical system to expose and transfer a pattern formed on the mask to the photosensitive substrate.

In a projection exposure apparatus of this type, the image forming characteristics of the projection optical system are corrected in accordance with the focus state of a mask pattern image formed on the photosensitive substrate, control is performed such that a distance between the photosensitive substrate and the projection optical system becomes constant, and the focus state of a mask pattern image projected on the photosensitive image is optimized.

In such a projection exposure apparatus, a plurality of masks are placed on a mask holder in correspondence with an increase in exposure range on the photosensitive substrate, and the mask holder is moved so that the respective masks are sequentially positioned with respect to the optical axis of the projection optical system. The masks are sequentially exchanged to combine the projected images on the photosensitive substrates, and exposure is performed after the projected images are set to overlap each other.

When a plurality of masks are placed on a movable mask holder and are to be sequentially positioned with respect to the optical axis of the projection optical system while moving the mask holder, the masks placed on the mask holder have different positions along the optical axis. As a result, a conjugate relationship with respect to the projection optical system cannot be kept constant, a projected image on the photosensitive substrate is distorted, and image quality is degraded.

This problem is also posed by a scanning exposure apparatus for scanning a movable mask stage and a substrate stage for holding a photosensitive substrate with respect to a projection optical system. More specifically, a positional relationship (distance) between a mask at a currently scanned position and the photosensitive substrate is changed due to an influence of parallelism between the mask and the photosensitive substrate. Therefore, the conjugate relationship changes.

As one method of solving the above problem, there may be a method of arranging, to the mask holder, an adjusting means for correcting the height (position along the optical axis) and inclination with respect to the optical axis in accordance with the focus state of a projected image. In this case, the arrangement of the projection exposure apparatus is complicated to an extent corresponding to the arrangement of the adjusting means in the mask holder, thus resulting in high manufacturing cost.

SUMMARY OF THE INVENTION

The present invention has been made in consideration of the above situation, and has as its object to provide a projection exposure apparatus capable of properly setting a focus state of an exposure pattern (transfer image) on a photosensitive substrate with a simple arrangement.

In order to achieve the above object of the present invention, there is provided a projection exposure apparatus for transferring a pattern on a mask to a photosensitive substrate through a projection optical system, comprising detecting means for measuring distances between a mask surface (e.g., a pattern drawing surface) and the projection optical system at a plurality of positions and detecting deviations when measurement results are different from a predetermined set value, and driving means for moving the photosensitive substrate with respect to an optical axis of the projection optical system and inclining the photosensitive substrate with respect to the optical axis on the basis of the deviations obtained by the detecting means.

According to the present invention, there is also provided a projection exposure apparatus for transferring a pattern on a mask to a photosensitive substrate through a projection optical system, comprising measuring means for measuring distances between a mask surface and the projection optical system at a plurality of positions, and driving means for moving the photosensitive substrate with respect to an optical axis of the projection optical system and inclining the photosensitive substrate with respect to the optical axis on the basis of the distances obtained by the measuring means.

According to the present invention, there is further provided a projection exposure apparatus for transferring a pattern on a mask to a photosensitive substrate through a projection optical system, comprising mask placing means for integrally placing a plurality of masks and selectively positioning the plurality of masks with respect to an optical axis of the projection optical system, measuring means for measuring distances between each selected mask and the projection optical system at a plurality of positions, and driving means for moving the photosensitive substrate along the optical axis and inclining the photosensitive substrate with respect to the optical axis on the basis of the distances obtained by the measuring means.

According to the present invention, as described above, the position (height and inclination) of the mask with respect to the optical axis of the projection optical system is measured, and the height and inclination of the photosensitive substrate are corrected on the basis of the measurement result. Exposure can be performed in a good image formation state while always maintaining a conjugate relationship between the mask and the photosensitive substrate without arranging a special position adjustment mechanism on a mask side.

DESCRIPTION OF THE PREFERRED EMBODIMENTS

An embodiment of the present invention will be described in detail with reference to the accompanying drawings.

Figure 1:
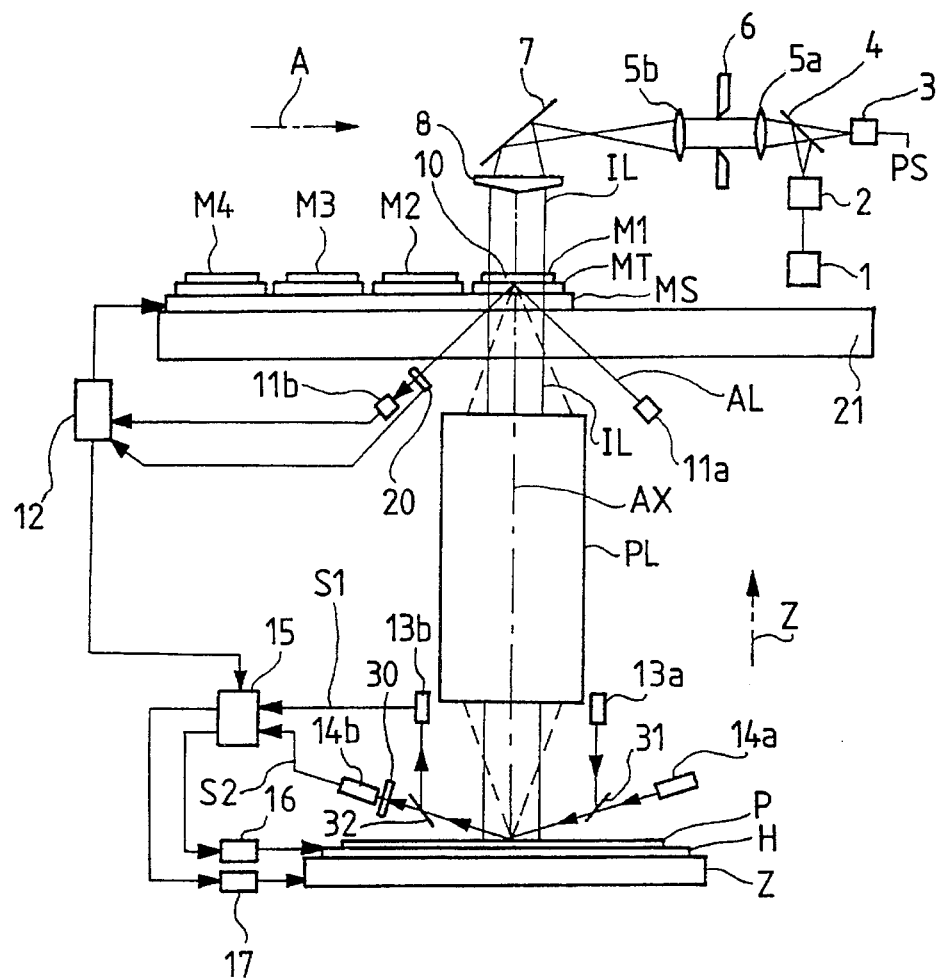
FIG. 1 is a side view showing a projection exposure apparatus according to an embodiment of the present invention.

FIG. 1 shows the overall arrangement of a projection exposure apparatus. An exposure illumination light source 1 such as an ultra-high-pressure mercury lamp or an excimer laser source emits illumination light IL (e.g., a g- or i-ray, or ultraviolet pulse light as of a KrF excimer laser) having a wavelength (exposure wavelength) for sensitizing a resist layer. The emitted light is incident on an illumination optical system 2.

The illumination optical system 2 uniforms the illumination light IL and reduces speckles. The resultant light emerges to a mirror 4. The illumination light IL emitted from the illumination optical system 2 and incident on the mirror 4 is reflected by the mirror 4. The light is reflected by a mirror 7 through a relay lens 5a, a variable blind mechanism (field stop) 6, and a relay lens 5b. The reflected light reaches a main condenser lens 8, so that the light uniformly illuminates a pattern area of a mask M1 with a predetermined illuminance.

The illumination light IL which illuminates the pattern area of the mask M1 passes through the mask M1 and reaches a projection optical system PL. An image of the pattern of the mask M1 is formed on a photosensitive substrate P. Light reflected by the photosensitive substrate P illuminated with the illumination light IL passes through the mirror 4 and is incident on a photodetector (light amount monitor) 3. The photodetector 3 photoelectrically detects the reflected light to obtain optical information (intensity value) PS. The optical information PS is input to a controller (not shown). The optical information PS serves as data for obtaining a variation amount of the image forming characteristics of the projection optical system PL.

As a means for holding the mask M1, a mask stage MS movable in a direction indicated by an arrow A or a direction opposite thereto is supported on a base 21. The mask M1, and masks M2, M3, and M4 are respectively placed on a plurality of mask tables MT formed on the mask stage MS.

The mask stage MS is moved by a controller 12 in the direction indicated by the arrow A or a direction opposite thereto and is positioned such that the central positions of the pattern areas of the masks M1 to M4 selectively match an optical axis AX of the projection optical system PL.

As a means for holding the photosensitive substrate P, a leveling holder H capable of changing the angle of the photosensitive substrate with respect to the optical axis AX is arranged on a z-axis stage driven by a z-axis driver 17 in the z-axis direction (optical axis). The photosensitive substrate P is placed on the leveling holder H. The leveling holder H can cause a leveling driver 16 to change the angle of the illumination light IL incident on the photosensitive substrate P with respect to the optical axis AX.

As a means for measuring the height (position along the optical axis) and inclination of a mask, selected from all the masks M1 to M4 placed on the mask table MT, which is located on the optical axis AX for the illumination light IL, detection light (laser beam) AL from a detection light-emitting element 11a is radiated on a reference surface within the pattern drawing surface of the mask (M1) located on the optical axis AX, and detection light AL reflected by this reference surface is received by a light-receiving element 11b through plane-parallel plate glasses 20.

At this time, the controller 12 moves the plane-parallel plate glasses 20 such that the optical axis for reflected light of the detection light AL on the mask is aligned with the optical axis of the light-receiving element 11b. A deviation of the mask position with respect to the reference position is obtained from a difference between the controlled position and a set value (i.e., the position at which the plane-parallel plate glasses 20 are located in advance).

The detection light-emitting element and the light-receiving element which detect the height and inclination of the mask are mounted with the same reference as that of the projection optical system PL (i.e., these elements are mounted integrally with the projection optical system), and the distance between the elements and the projection optical system PL is always kept constant. The light reception result of the light-receiving element 11b which has received the detection light AL represents a distance between the mask pattern and the projection optical system PL.

Figure 2:
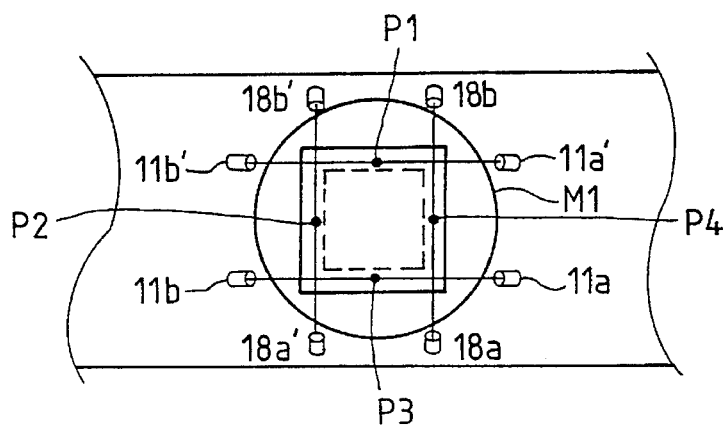
FIG. 2 is a schematic plan view showing the arrangement of a mask position detection system according to the present invention.

FIG. 2 is a view showing the layout of detection light-emitting elements and light-receiving elements, both of which are used to detect the height and inclination of a mask. This layout consists of a first detection system consisting of the detection light-emitting element 11a and the light-receiving element 11b, a second detection system consisting of a detection light-emitting element 11a' and a light-receiving element 11b', a third detection system consisting of a detection light-emitting element 18a and a light-receiving element 18b, and a fourth detection system consisting of a detection light-emitting element 18a' and a light-receiving element 18b'.

By these four detection systems, the heights of points P1 to P4 of the mask M1 (or M2, M3, or M4) positioned on the optical axis for the illumination light IL are detected, so that deviations, from the reference positions, of the height of the mask M1 (M2, M3, or M4) and inclination with respect to the optical axis can be detected.

As a means for detecting the inclination of the photosensitive substrate P placed on the leveling holder H with respect to the optical axis AX and the height in the z-axis direction, there are provided a horizontal position detection system (13a and 13b) and a focus position detection system (14a and 14b) (FIG. 1). The horizontal position detection system and the focus position detection system comprise light sources 13a and 14a for emitting illumination light beams incident on the surface of the photosensitive substrate P obliquely with respect to the optical axis AX, a half mirror 31, light-receiving elements 13b and 14b for receiving reflected light from the surface of the photosensitive substrate P, a half mirror 32, and plane-parallel plate glasses 30.

Illumination light emitted from the light source 13a is a parallel beam, and illumination light emitted from the light source 14a is a focused beam to form a pinhole or slit image.

A substrate controller 15 controls the leveling driver 16 and the z-axis driver 17 on the basis of light-receiving detection signals S1 and S2 from the light-receiving elements 13b and 14b to drive the z-axis stage Z and the leveling holder H. The height of the photosensitive substrate P placed on the leveling holder in the z-axis direction and its inclination with respect to the optical axis AX are adjusted, and the optimal image forming position of the photosensitive substrate P in the projection optical system can be determined.

In this embodiment, the angle of the plane-parallel plate glasses 30 is determined in advance such that reflected light is focused to the reference position (e.g., the center) of the sensor in the light-receiving element 14b when the photosensitive substrate coincides with an optimal image forming plane. Calibration of the focus position detection system is performed on the basis of this. At the same time, when the photosensitive substrate P coincides with the optimal image forming plane, the horizontal position detection system is calibrated such that the parallel beam from the light source 13a is focused to the central position of the sensor in the light-receiving element 13b.

The deviations, from the mask reference positions, of the height of the mask M1 (M2, M3, or M4) and its inclination with respect to the optical axis X, which deviations are detected by the controller 12, are output to the substrate controller 15. The leveling holder H and the z-axis stage Z are driven on the basis of these deviations, and the photosensitive substrate P is located to be conjugate with the mask M1 (M2, M3, or M4).

Figure 3:
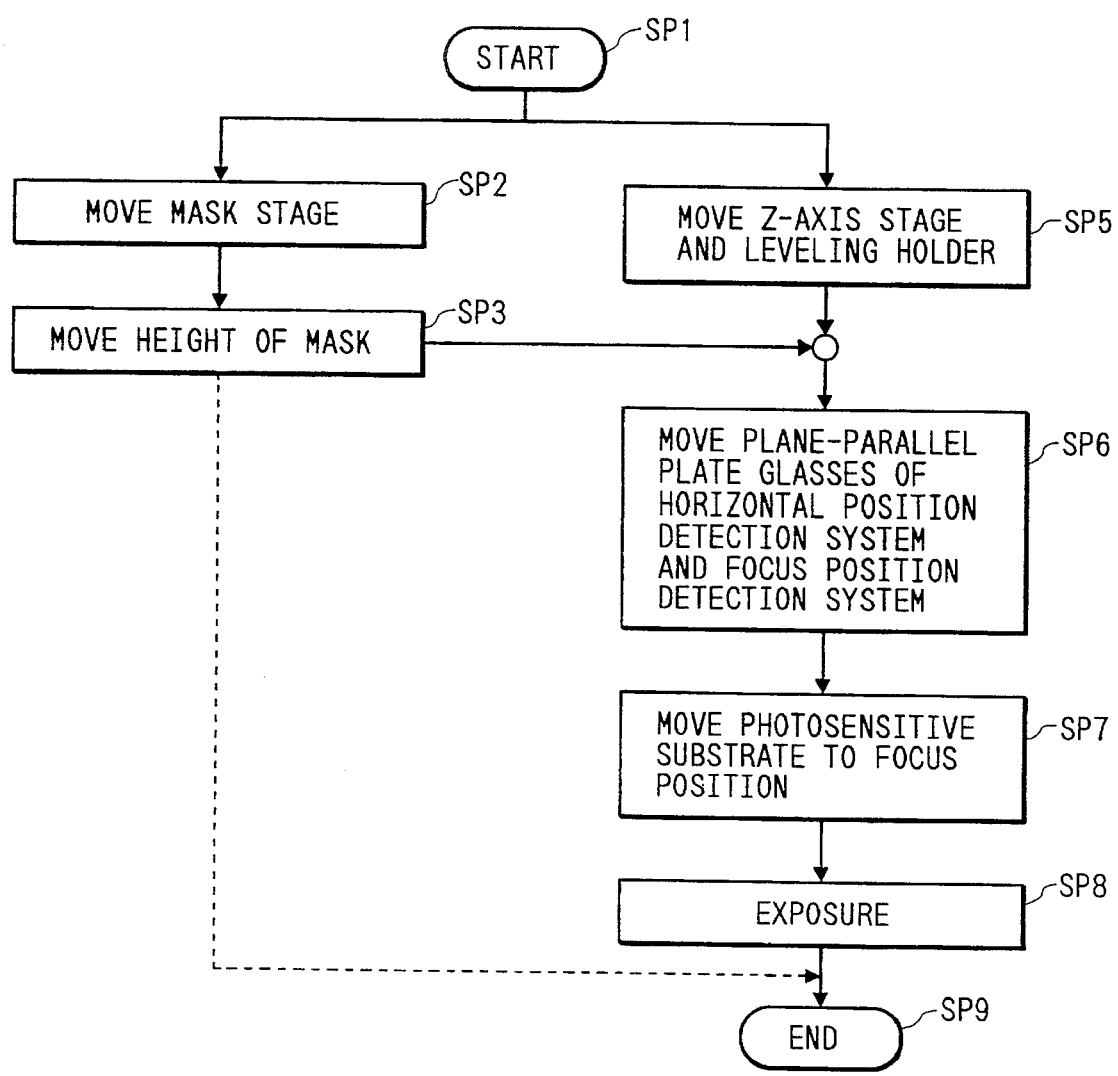
FIG. 3 is a flow chart showing an exposure processing sequence according to the present invention.

FIG. 3 shows the exposure processing sequence in the projection exposure apparatus according to the present invention. A main controller (not shown) starts this processing sequence from step SP1. In step SP2, the mask stage MS is moved such that the center of the pattern area of any one (e.g., M1) of the plurality of masks M1 to M4 is aligned with the optical axis AX for the illumination light IL. In addition, in step SP3, the main controller measures the deviations of the mask height and its inclination with respect to the optical axis AX.

In step SPS, the main controller moves the stage (i.e., the z-axis stage Z and the leveling holder H) for the photosensitive substrate to move the photosensitive substrate P to a predetermined reference position (initial position). In this state, in step SP3, the main controller sends out the measured deviations of the mask height and inclination to the substrate controller 15. In step SP6, the main controller moves the plane-parallel plate glasses 30 to a position corresponding to the mask deviation. In step SP7, the main controller moves the photosensitive substrate P to a focus position (optimal image forming plane).

In this manner, when the photosensitive substrate P is moved to the position (optimal image forming plane) corresponding to the deviation of the mask M1 (M2, M3, or M4) positioned on the optical axis AX with respect to the reference position, the mask M1 is set to have a conjugate positional relationship with the photosensitive substrate P. Exposure is then performed in step SP8.

Figure 4:
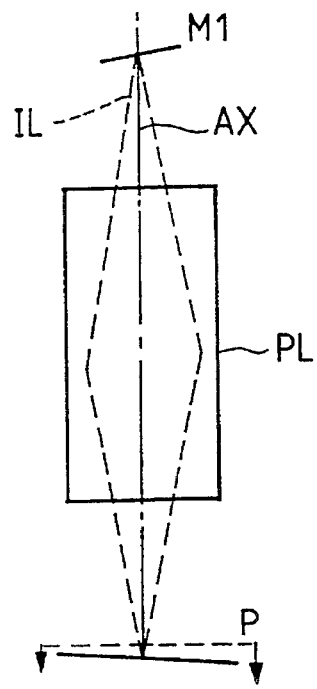
FIG. 4 is a schematic view showing a state of correcting a mask and a photosensitive substrate.

As shown in FIG. 4, even if the mask M1 is displaced from the reference position, the photosensitive substrate P is moved on the basis of the deviations (i.e., the height and the inclination with respect to the optical axis AX) from the reference positions of the mask M1, so that the mask M1 and the photosensitive substrate P can always be kept in the conjugate positional relationship.

With the above arrangement, in the projection exposure apparatus having the mask stage MS capable of moving the plurality of masks M1 to M4 on a plane perpendicular to the optical axis, when each mask M1, M2, M3, or M4 is positioned on the optical axis AX for the illumination light IL, and even if the height of the mask and the inclination thereof are deviated from the predetermined reference positions, the deviations can be corrected on the photosensitive substrate P side. Therefore, a means for adjusting the mask height and its inclination need not be arranged on the mask stage MS side. With a simple arrangement, an optimal image formation state of the exposure pattern on the photosensitive substrate P can be obtained.

In the above embodiment, the calculation of the deviations of the height and inclination of the mask positioned with respect to the optical axis AX for the illumination light IL has been exemplified. However, the present invention is not limited to this. A distance between a mask and the projection optical system PL may be directly measured.

Figure 5:
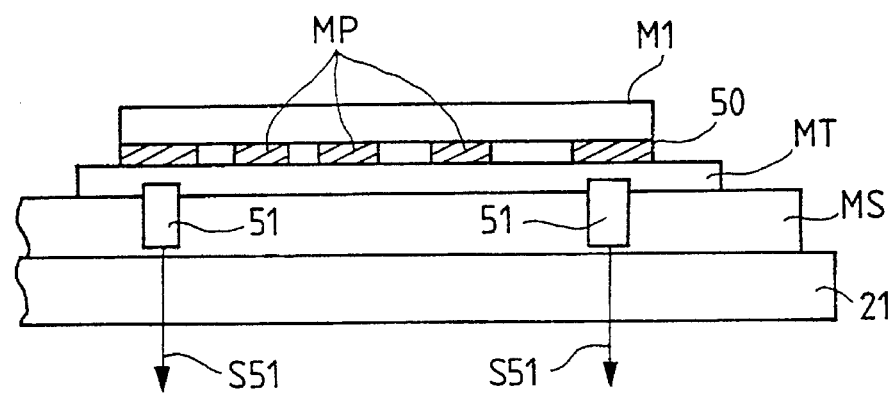
FIG. 5 is a side view showing a mask position measuring system according to another embodiment of the present invention.

In this case, as shown in FIG. 5 wherein the reference numerals as in FIG. 1 denote the same parts in FIG. 5, position sensors 51 fixed (i.e., the positions with respect to a projection optical system PL are kept unchanged) to the projection optical system PL are formed on a Cr (chromium) surface 50 corresponding to portions having no patterns MP of a mask pattern surface. Each position sensor 51 is constituted by a sensor utilizing an eddy current. Each position sensor 51 outputs a detection signal S51 representing a voltage value representing a distance with respect to the Cr surface 50.

The mask position is detected using these position sensors 51, and the same processing sequence as described with reference to FIG. 3 is performed on the basis of the detection results from the position sensors 51. More specifically, in FIG. 3, a main controller starts this processing sequence in step SP1. In step SP2, the main controller moves a mask stage MS and positions one of a plurality of masks M1 to M4 with respect to an optical axis AX of illumination light IL. In step SP3, the height and inclination of the mask are measured on the basis of the detection signals S51 from the position sensors 51.

In step SP7, the main controller corrects the position of the photosensitive substrate on the basis of these measurement results, and then exposure is performed.

As described above, even if the height and inclination of the mask are directly measured using the position sensors 51 fixed to the projection optical system PL, exposure can be performed while keeping the positional relationship between the mask and the projection optical system constant.

In the above embodiment, the present invention has been applied to the projection exposure apparatus using the mask stage MS on which the plurality of masks M1 to M4 are placed. However, the present invention is not limited to this. The present invention is also applicable to a projection exposure apparatus for fixing only one mask and exposing this mask.

For example, in a scanning exposure apparatus for performing exposure upon scanning a mask and a photosensitive substrate with respect to a projection optical system, the position and inclination of a mask at a currently scanned position (i.e., a position as an exposure area during scanning) are detected by the above detection system. The position and inclination of the photosensitive substrate can be controlled on the basis of the detection result.

What is claimed is:

1. An exposure apparatus comprising:

a projection optical system for projecting a pattern formed on a mask onto a photosensitive substrate;

measuring means for measuring distances between said mask and said projection optical system at a plurality of positions within a surface of said mask; and driving means for changing a position of said photosensitive substrate with respect to said projection optical system on the basis of a plurality of the distances measured by said measuring means.

2. An apparatus according to claim 1, wherein said driving means changes a position of said photosensitive substrate along an optical axis of said projection optical system.

3. An apparatus according to claim 1, wherein said driving means changes an angle of said photosensitive substrate with respect to the optical axis of said projection optical system.

4. An apparatus according to claim 1, further comprising detecting means for detecting deviations, from a predetermined set value, of the distances measured by said measuring means, and wherein said driving means changes the position of said photosensitive substrate with respect to said projection optical system on the basis of a plurality of the deviations detected by said detecting means.

5. An apparatus according to claim 1, further comprising mask placing means for integrally holding a plurality of said masks and selectively positioning said plurality of masks with respect to the optical axis of said projection optical system, and wherein said measuring means measure distances between said each selected mask and said projection optical system at a plurality of positions within the surface of said mask, and said driving means changes the position of said photosensitive substrate with respect to the optical axis of said projection optical system for said plurality of masks on the basis of the distances measured by said measuring means.

6. An exposure method comprising the steps of:

locating a mask and a photosensitive substrate at positions conjugate with respect to a projection optical system;

measuring distances between said mask and said projection optical system at a plurality of positions within a surface of said mask; and changing the position of said photosensitive substrate with respect to said projection optical system on the basis of a plurality of the measured distances.

7. A method according to claim 6, further comprising the step of changing a position of said photosensitive substrate along an optical axis of said projection optical system.

8. A method according to claim 6, further comprising the step of changing an angle of said photosensitive substrate with respect to an optical axis of said projection optical system.

9. A method according to claim 6, further comprising the step of obtaining deviations of the measured distances from a predetermined set value, thereby changing the position of said photosensitive substrate with respect to said projection optical system on the basis of the deviations.

10. An exposure method comprising the steps of:

selectively locating a plurality of masks to a position conjugate with a photosensitive substrate through a projection optical system;

measuring distances between said selected mask and said projection optical system at a plurality of positions within a surface of said selected mask; and changing the position of said photosensitive substrate with respect to an optical axis of said projection optical system on the basis of a plurality of the measured distances.

* * * * *